United States Patent [19]
Kline

[11] 4,080,589
[45] Mar. 21, 1978

[54] ERROR DENSITY DETECTOR

[75] Inventor: Ralph LeRoy Kline, Los Altos, Calif.

[73] Assignee: GTE Automatic Electric Laboratories Incorporated, Northlake, Ill.

[21] Appl. No.: 583,147

[22] Filed: Jun. 2, 1975

[51] Int. Cl.² .................................................. H03K 5/18
[52] U.S. Cl. ...................... 340/146.1 AX; 235/92 EC; 245/92 R
[58] Field of Search .......... 235/92 EC, 92 TE, 92 R, 235/153 A, 153 AP, 153 BK, 153 AC, 153 AE, 153 AK, 153 AM, 153 AS, 153 B; 340/146.1 C, 146.1 AB, 146.1 A, 146.1 AX, 146.1 AG, 146.1 AJ, 147 R

[56] References Cited

U.S. PATENT DOCUMENTS

| | | | |
|---|---|---|---|
| 3,036,290 | 5/1962 | Zarouni | 340/146.1 AX |
| 3,396,368 | 8/1968 | Lakhani | 340/146.1 |
| 3,525,044 | 8/1970 | Richmond | 235/92 TF |
| 3,646,517 | 2/1972 | Waters | 340/146.1 AB |
| 3,725,860 | 4/1973 | Kemper et al. | 340/146.1 AX |

OTHER PUBLICATIONS

Austin et al., Error Frequency Warning Detector. . ., Nov., 1969, IBM Tech. Discl. Bull., vol. 12, No. 6, p. 895.

Primary Examiner—Joseph M. Thesz
Attorney, Agent, or Firm—Leonard R. Cool; Russell A. Cannon

[57] ABSTRACT

An initial error indicated by a pulse at the binary input is applied through a gating circuit to trigger a monostable multivibrator (one-shot) to start a timing interval. The output of the one-shot is applied to a second gating circuit which inhibits the first gating circuit to prevent retriggering of the one-shot. Subsequent error pulses are then applied directly to a counting mechanism which counts the errors which occur during the predetermined time interval established by the one-shot. An acceptable error density is established by the predetermined time interval for the one-shot in relation to the number of errors that would occur during this predetermined time interval. If the number of errors which occur exceeds the acceptable error density, the counting circuit puts out a signal which may be applied to an alarm (or framing) circuit. Once the error counter produces an output, i.e., exceeds the acceptable error density, the counter applies a binary indication to the second gating circuit which causes the first gating circuit to retrigger the one-shot. Further, each error pulse which occurs before the one-shot times out will now trigger the one-shot. In order for the circuit to reset, an error-free period, equal to the period of the one-shot, must occur.

8 Claims, 5 Drawing Figures

ERROR DENSITY DETECTOR

BACKGROUND OF THE INVENTION

1. Field of the Invention

This invention relates to error counters for a digital transmission system and, in particular, to an error density detector for digitally counting errors during a first predetermined time interval until a fixed number (full count) of errors occurs within the first predetermined time interval. After a full count is attained, each subsequent error resets a timer which holds the full count until the timer times out.

DESCRIPTION OF THE PRIOR ART

In a number of prior-art systems which employ digital transmission techniques, the presence of an occasional error is not critical to the recovery of the information contained in the transmitted signal. For example, PCM systems in common use in the United States today employ pulse code groups for each of the 24 channels within the system, each code group containing eight digits. Thus, 192 digits represent the time slots or the total number of digits for each channel of the 24-channel group for each frame. In addition to the 24 groups, there is a winking framing pulse added at the end of the $192^{nd}$ digit so that each frame contains 193 time slots with the winking framing pulse occurring in the $193^{rd}$ time slot. An occasional error could occur in any one of the pulse code groups or an error could occur in the time slot for the framing digit such that the 1 could be represented as a 0 or the 0 could be represented as a 1 without the occasional errors having a significant deleterious effect on the decoding of the received information. In either case, it is not the occasional error which creates a problem, but it is the repetition of errors occurring within a predetermined time interval which is indicative either of trouble in the transmission medium or in the transmission equipment. Thus, an error density is used to determine at what point in time the number of errors occurring is critical to transmission. Error density is related to the number of errors detected within a predetermined time interval.

As is well known, opposite ends of a digital transmission system are said to be synchronized when the clock frequencies have the same frequency and phase. With respect to PCM systems, it is additionally necessary that they be in step with respect to the digits in the code groups. When the transmitter and receiver are properly synchronized, they are described as being in frame. When they are not properly synchronized, they are described as being out of frame. Thus, identification of the framing information at the receiving end of the system is important, and a means for comparison with respect to what the actual framing condition, i.e., 1 or 0, is supposed to be is of importance. However, it is also important not to restart a reframing cycle on the first detection of an error in the framing comparator. This is discussed in detail on pages 1 – 15, and in particular pages 14 – 15, in the article by Davis, C. P., "An Experimental Pulse Code Modulation System for Short-Haul Trunks," Bell System Technical Journal, volume 41, January 1962. FIG. 10 at page 16 shows a simplified drawing of a framing detector using the incoming signal from the received PCM line, and it should be particularly noted that an integrator is used at the output of the framing detector to integrate errors which are recognized by the detector, with a particular level being reached before an out-of-frame condition is indicated.

Another arrangement for error detection is disclosed in U.S. Pat. No. 3,048,819 which relates to pulse code communications and, in particular, to means for detecting and measuring errors in a pseudoternary pulse code. In this patent, the pseudo-ternary pulse code is constrained to be alternatively positive and negative, but contrary to this constraint, framing pulses are always of the same polarity as the last preceding message pulse. In such pseudo-ternary code, two consecutive message pulses of the same polarity cannot legitimately occur, and when they are so indicated they are in violation of the code and would indicate an error. But where a framing pulse is also constrained to be the same polarity as the next preceding message pulse, this also is a violation of the coding pattern, and the circuit arrangement must determine whether a violation is an error, in fact, or is in fact a framing pulse. The subject error detection and measurement arrangement shown in U.S. Pat. No. 3,048,819 provides for error outputs to be registered in error registration 52. As nearly as can be determined from the careful reading of the patent, the error registration circuit 52 simply counts the errors which occur.

It is also possible to detect errors in data transmission systems and, in particular, those which employ the duobinary waveform. An error detection arrangement is disclosed in U.S. Pat. No. 3,303,462. Further, the patent discloses a digital counting arrangement for counting the number of errors which occur and, in addition, the counting arrangement uses a clock reset input whereby the counter is reset to 0 periodically. It is important to note that the clock reset timing is independent of error occurrences, and the error counting arrangement includes no provision for resetting the counter 29 after a predetermined period in which no errors occur.

SUMMARY OF THE INVENTION

An initial error signal applied to the input of the error density detector effects a logic means which, in turn, provides a signal to actuate a timer. The timer is set for a predetermined time interval and subsequent errors occurring during this interval are applied to a counting arrangement in the detector. If the number of errors occurring during the predetermined time interval is less than a fixed number, the timer will time out and will reset the counting arrangement. If the number of errors occurring during the predetermined time interval exceeds the fixed number, the detector provides one output which may be used to actuate an alarm circuit. In addition, the detector provides a second output which is applied to the logic means. The logic means reactuates the timer and is now also set so that each subsequent error occurring will again actuate the timer. Thus, a second predetermined time interval, during which no errors occur, is necessary before the timer will time out and reset the counting arrangement. The second predetermined time interval may be less than, equal to, or greater than the first predetermined time interval.

DETAILED DESCRIPTION OF THE INVENTION

Figure 1:
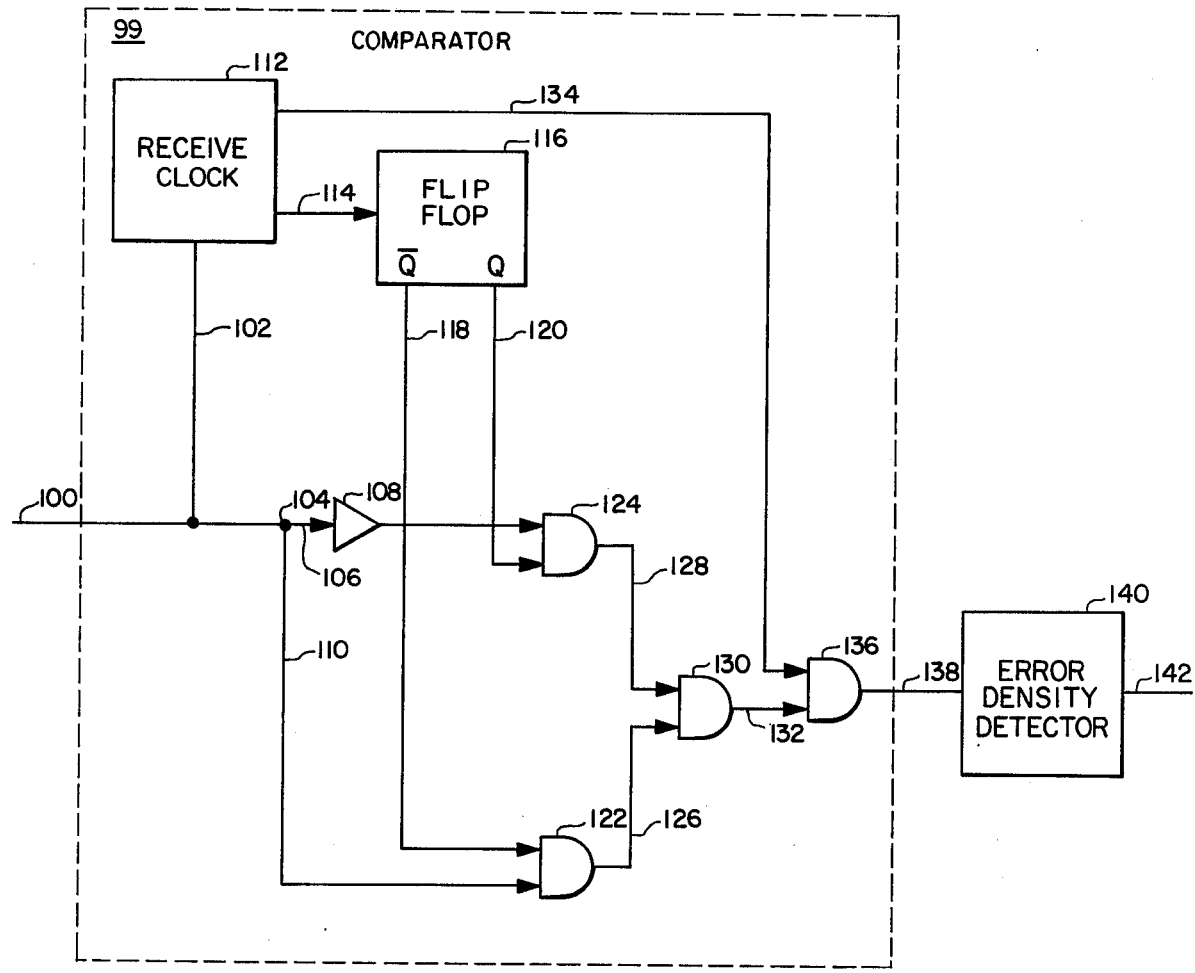
FIG. 1 is a simplified block diagram showing a digital comparator, for detecting errors in the framing of a PCM signal, and an error density detector.

Referring to FIG. 1, 99 is a comparator and is shown to include the receive clock and framing digit generator 112, which receive clock receives input information from the PCM signal applied on path 100 via path 102. The receive clock receives timing and framing information from the incoming line signal and outputs frame synchronization information on paths 114 and 134. The incoming PCM signal on path 100 divides at junction 104 and is applied by path 106 to inverter 108 and thus provides an inverted input to AND-gate 124. In addition, the incoming PCM signal is applied from junction 104 via path 110 directly to AND-gate 122. AND-gates 122 and 124 each have a second input which are, respectively, connected to the Q and Q outputs of flip-flop 116 via paths 118 and 120. Flip-flop 116 is set so that in the proper operating alignment, the Q output is 1 when the framing winking pulse input is also 1. So long as the receive clock and framing digit generator are in synchronism with the framing pulse on receive path 100, neither AND-gate 122 nor AND-gate 124 has an output. Thus, there is no signal on either path 126 or path 128 to OR-gate 130. Further, there is no signal input from OR-gate 130 to one input of AND-gate 136. The other input to AND-gate 136 is from the receive clock and framing digit generator over path 134.

Figure 4:
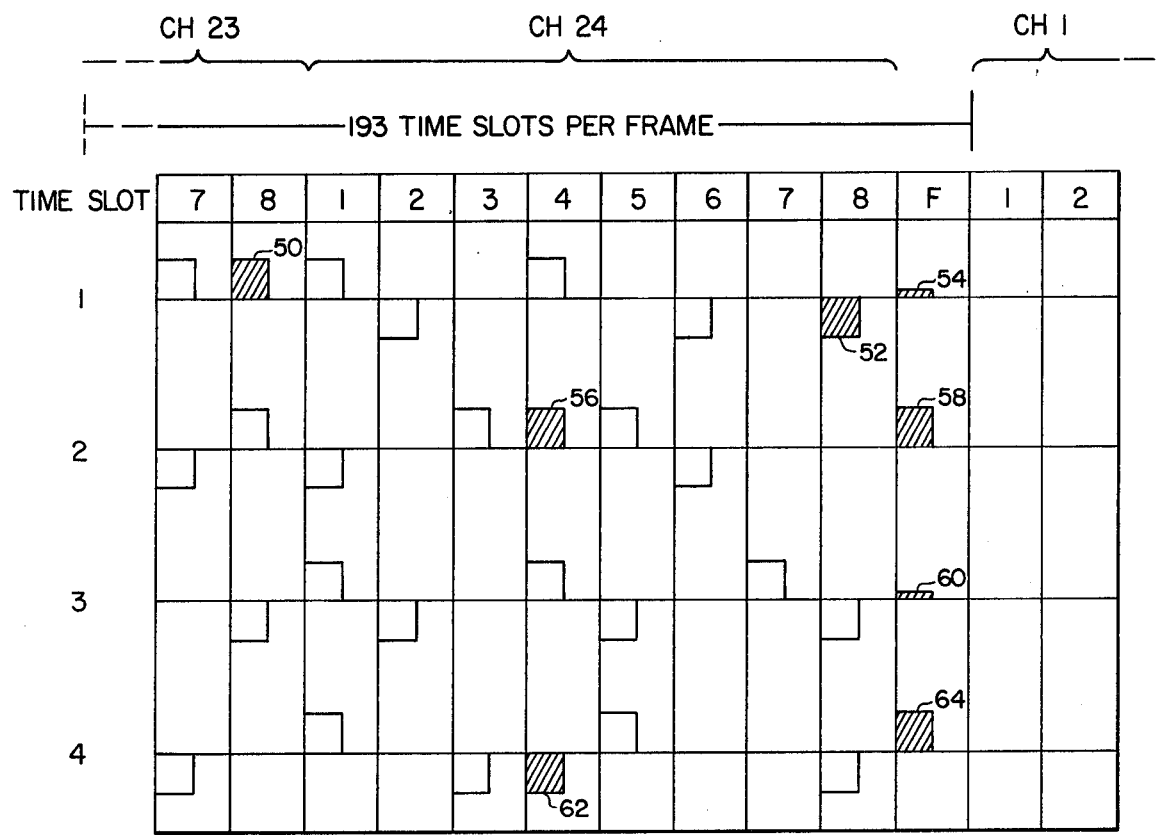
FIG. 4 is a waveform diagram illustrating both bipolar errors and framing errors in PCM system.

Referring now to FIG. 4, portions of waveforms for four frames of a 24-channel PCM signal are shown and include the last two time slots of channel 23, the full eight time slots of channel 24, and the first two time slots of channel 1. The symbol F in the time slot following the eighth time slot for channel 24 is the framing pulse. The correctly received digits are shown without crosshatching, and errors either within the pulse code groups or in the framing time slots are shown crosshatched. Note further that the pulses shown are return-to-zero (RZ) pulses. Error pulses 50, 52, 56, and 62 are violations of the pseudo-ternary waveform which is constrained to have digits representing information in binary form, alternately positive and negative. Digits 54, 58, 60, and 64 are indicative of framing errors. The framing errors are the ones which are important with respect to FIG. 1, and it should be noted that when a framing pulse is to occur that the output of inverter 108 should be a 0. However, pulse 54 is in effect 0 (i.e., no pulse) and thus the output of the inverter 108 is a 1 which, applied with the Q output on path 120 which also is 1, provides a pulse output on path 128 to OR-gate 130, and thus to path 132 to AND-gate 136. At the same time, a framing pulse from receive clock and framing digit generator 112 appears on path 134 to the second input of AND-gate 136, providing an error output on path 138 to error density detector 140. Since the Q output on path 118 is a 0 during this time slot, AND-gate 122 does not provide an output on path 126. However, when framing digit pulse 58 occurs, which is in contrast to the 0 that should be present during the second frame as shown in FIG. 4, then AND-gate 122 will have an output pulse since the Q output from flip-flop 116 on path 118 to one input of AND-gate 122 will be a 1 and the direct input from the PCM line will also be a 1. Thus, another error will be indicated ultimately at path 138.

For PCM systems, the error density detector normally establishes a threshold which is N framing errors within a specified number of frames before any output indication is provided. Typical errors are three errors out of seven frames and four out of nine. The error density threshold is established depending upon the application. If the number of errors specified has occurred during the predetermined number of frames, the system is considered to be out of frame, and a search on a time-slot-by-time-slot basis is initiated to find the proper framing time slot. Once a time slot is found which contains an alternating framing pattern, the error density detector must determine that a specific number of frames has occurred in which the alternating framing pattern is correct, and thus no errors in framing have been identified before deciding that the correct framing time slot has been found.

Figure 2:
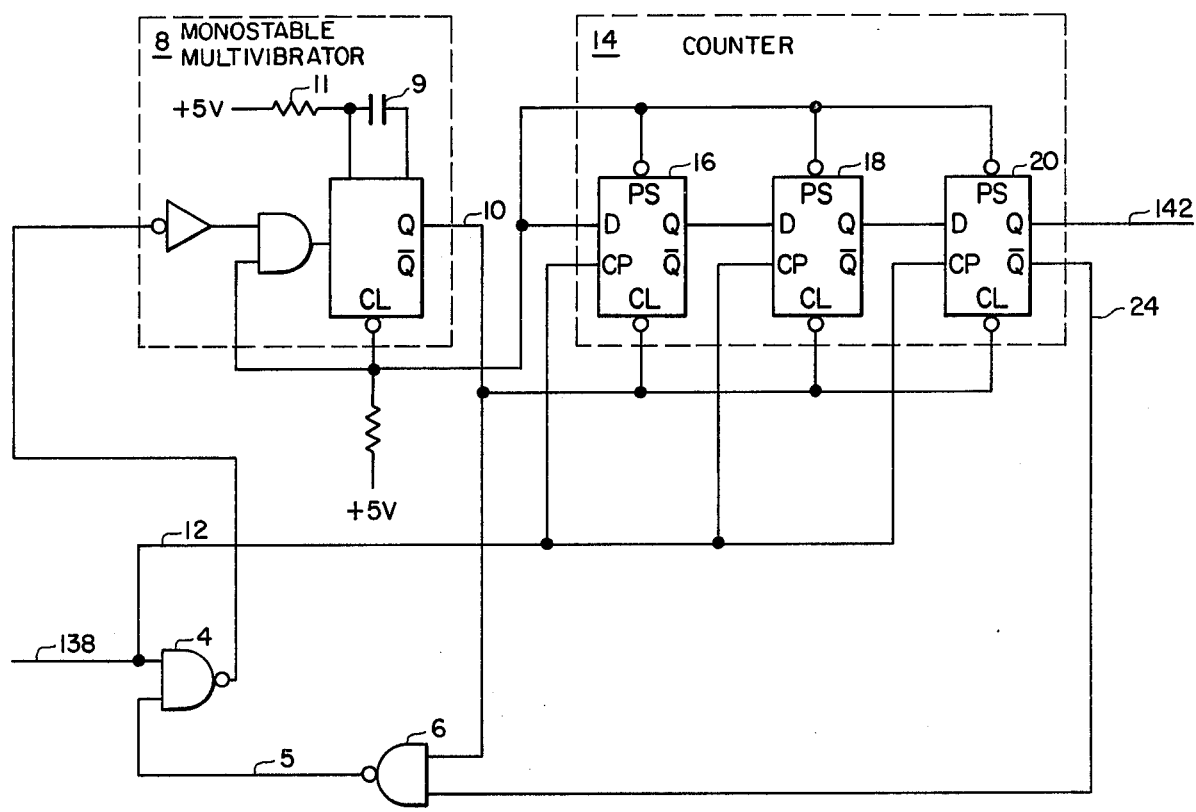
FIG. 2 is an elementary block diagram of one embodiment of the error density detector of the invention in which the first and second predetermined time intervals are the same.

While not specifically limited to the measurement of error densities of framing signals, the embodiment of applicant's invention as illustrated in FIG. 2 provides a mechanism whereby each of the requirements may be achieved by digital techniques. The normal input on path 138 is normally low, i.e., without errors occurring the input on path 138 is a 0. When an error occurs, a logic 1 pulse appears on the input path 138. The first error input (high) after a period of no errors produces a logic 0 pulse at the output of NAND-gate 4 which triggers monostable multivibrator (one-shot) 8. The output on path 10 goes from 0 to 1 and is applied to the clear input of each flip-flop of counter 14 and to one input of NAND-gate 6. Flip-flop 20 provides a 1 output on path 24 to another input of NAND-gate 6. The output of NAND-gate 6 goes low, providing a 0 on path 5 to a second input to NAND-gate 4, and this forces NAND-gate 4 to a 1 output which prevents one-shot 8 from being retriggered. The flip-flops of counter 14 now act as a shift register in which each subsequent error input on path 138 sets the next flip-flop in the register until either all are set or the one-shot times out and automatically resets all the flip-flops in counter 14. If sufficient errors occur so that counter 14 reaches a full count before the one-shot 8 times out, then flip-flop 20 will change state. This causes a 1 to appear on lead 142 and a 0 to occur on path 24 to one input of NAND-gate 6. The output of NAND-gate 6 applies a 1 via path 5 to one input to NAND-gate 4. The error pulse which set flip-flop 20 is still present as a 1 on path 138 and is combined with a 1 on path 5, thereby causing gate 4 to provide a 0 at the input to one-shot 8 which retriggers it. This also allows subsequently detected errors, appearing on path 138, to retrigger the one-shot. Since counter 14 will not reset until one-shot 8 times out, a predetermined time interval is established during which no errors may occur before the error density detector can reset.

When used with the framing detector such as is shown in 99 of FIG. 1, the circuit as illustrated in FIG. 2 may be arranged to indicate an out-of-frame condition when four out of nine framing bits are in error. To do this, the one-shot 8 is timed for a period of between 8 and 9 times the time period between framing pulses. Thus, the first error pulse starts the one-shot 8, the second one sets flip-flop 16, the third sets flip-flop 18, and the fourth sets flip-flop 20 and indicates out of frame, provided all of these error pulses occur within the one-shot 8 time interval. Subsequent to the out-of-frame indication, the searching and reestablishment of a correct framing pattern must occur. Actually, the search process would continue to induce errors on path 138, thus continuing to retrigger one-shot 8 until the correct framing pattern has been attained. Because of the time interval determined for the four out of nine framing bits in error, it would require an interval of 8 consecutive framing patterns without errors before the circuit would reset. Thus, if 8 consecutive non-errors occur, the one-shot 8 times out and resets the error density detection circuit to the original in-frame condition.

Figure 3:
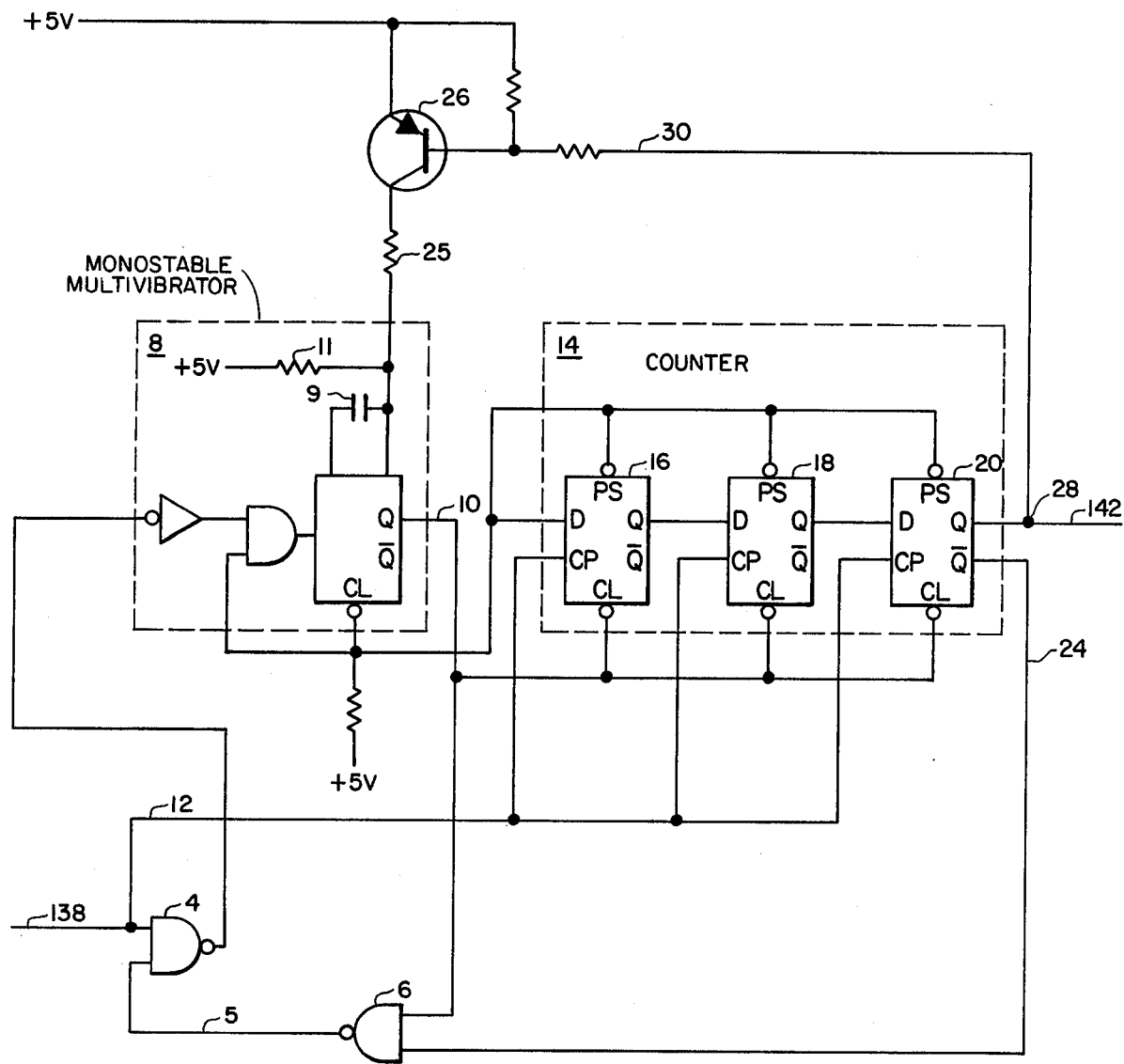
FIG. 3 is an elementary block diagram of a second embodiment of the error density detector of the invention wherein the basic error density detector is as shown in FIG. 2, but the timing arrangement is modified.

It may be desirable to have the time intervals during which errors are counted to be different from the reset time interval. An arrangement for accomplishing this result is shown in FIG. 3 where the basic error density detector is shown unchanged from that illustrated in FIG. 2, but where a time constant modification circuit is connected between the output path 142 and the junction between timing capacitor 9 and timing resistor 11 of the one-shot shown in 8. The timing modification circuit consists essentially of transistor 26 and resistor 25. When the error density detector is in its normal condition, i.e., before the error density has been exceeded, an output on path 142 from flip-flop 20 is a low, and this is applied via junction 28 and path 30 to the base of transistor 26. Transistor 26 is then turned on, and resistor 25 is in parallel with the initial timing resistor 11. The initial one-shot time interval is determined by the capacitor 9 and a parallel combination of resistors 11 and 25. When a full count is reached in counter 14, the output on path 142 is high, which in turn turns off transistor 26, and thus the timing interval is increased since only resistor 11 is included in the RC time constant. It should be noted that the opposite effect can be achieved if path 30 to the base of transistor 26 is connected not to output path 142 but to path 24 or to the Q output connection. The condition of transistor 26 will be reversed, and therefore when the full count occurs, transistor 26 will now be turned on, placing resistor 25 in parallel with resistor 11 thereby reducing the RC time constant for the one-shot. Thus, the error counting time interval will be longer than the reset time interval.

Figure 5:
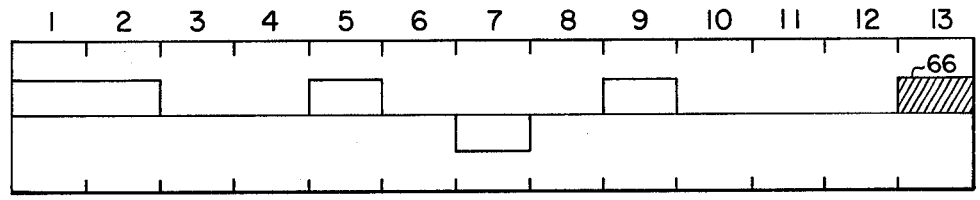
FIG. 5 is a waveform diagram which illustrates an error occurrence in a duobinary signal.

While the discussion of the use of the invention has been related to framing signals in a PCM environment, it is apparent that it is not so limited. As has been illustrated, apparatus is available which is capable of detecting error pulses such as 50, 52, 56, and 62 in the constrained, pseudo-ternary bit stream illustrated in FIG. 4. Further, errors which occur in duobinary bit streams, such as 66 in FIG. 5, are detectable since these errors violate coding rules. In either case, the detection circuit can be arranged to apply the desired input pulse to the pulse density detector as described hereinabove so as to set in motion the counting of errors during a predetermined time interval. The number of errors to be counted during this time interval would be established by the acceptable error rate. Thus, the time interval and the number of elements in the counter are determined. Further, the absence of errors for a second predetermined time interval, which interval may or may not be equal to the first time interval, permits the error density circuit to reset and thus remove the warning indication signal from the output path 142.

It is also to be noted that the number of errors that are needed for a full count may be varied by changing the number of stages in the counting mechanism 14. Other modifications of the error density detector may be made by those of ordinary skill in the art without departing from the spirit or scope of the invention.

What is claimed is:

1. In a digital system, an error density detector which comprises:
    means responsive to an initial error input signal to set a first predetermined time interval during which errors are to be counted;
    means for digitally counting each input error signal during said first time interval; said digital counting means providing an output error indication when a predetermined number of errors occur during said first predetermined time interval;
    means responsive to said error indication to set a second predetermined time interval during which said error indication will remain; and
    means responsive to each error input signal, which occurs after said error indication and prior to the termination of said second predetermined time interval, to reset said means which sets said second predetermined time interval.

2. An error density detector of claim 1 wherein said first and second predetermined time intervals are the same.

3. An error density detector of claim 1 wherein the means responsive to the initial error input signal further comprises:
    logic means having an input and an output, said input operatively connected to receive said error signals, said logic means responsive to said initial error input signal to provide a logic signal at said output; and
    timing means having an input operatively connected to the output of said logic means and responsive to the logic signal resulting from said initial error input signal for setting said first predetermined time interval; said timing means having an output operatively connected to said counting means and to a second input to said logic means.

4. The error density detector of claim 3 wherein said timing means is a retriggerable monostable multivibrator.

5. The error density detector of claim 3 wherein said digital counting means further comprises:
    an N-stage shift register having an input connected to a second output of said logic means; said shift register having two outputs, one said output providing said error indication where N errors occur during said first predetermined time interval.

6. The error density detector of claim 5 wherein said means to set said second predetermined time interval further comprises:
    means in said logic means responsive to the second output from said counting means, following an error indication, to set and hold said logic means in a state wherein each subsequent error is applied to said timing means to reset the timing means so long as at least one error occurs during said predetermined time interval.

7. The error density detector of claim 5 wherein said means to set said second predetermined time interval further comprises:
    means in said logic means responsive to the second output from said counting means, following an error indication, to set and hold said logic means in a state wherein each subsequent error is applied to the timing means so long as at least one error occurs during said second predetermined time interval; and time changing means operatively connected between one output of said counting means and said timing means so that said second predetermined time interval may be set to be less than or greater than said first predetermined time interval.

8. The error density detector of claim 7 wherein said time changing means further comprises:
- a resistor means having one end thereof connected to said timing means; and
- a transistor having a biasing circuit responsive to the output of said counting means so said transistor is not conducting when the output stage of said counting means is in one said state and the transistor is conducting when the output stage is in the other said state.

UNITED STATES PATENT AND TRADEMARK OFFICE
CERTIFICATE OF CORRECTION

PATENT NO. : 4,080,589
DATED : March 21, 1978
INVENTOR(S) : Ralph L. Kline

It is certified that error appears in the above-identified patent and that said Letters Patent are hereby corrected as shown below:

Column 2, line 4, "pseudoternary" should read -- pseudo-ternary --.

Column 3, line 25, "Q" first occurrence should read -- $\bar{Q}$ --, and same column, line 63, "Q" should read -- $\bar{Q}$ --.

Column 4, line 1, "Q" should read -- $\bar{Q}$ --.

Column 5, line 41, "Q" should read -- $\bar{Q}$ --.

Column 6, claim 6, line 8, after "said" insert -- second --.

Signed and Sealed this

Ninth Day of January 1979

[SEAL]

Attest:

RUTH C. MASON
*Attesting Officer*

DONALD W. BANNER
*Commissioner of Patents and Trademarks*